US011271282B2

(12) United States Patent
Jang

(10) Patent No.: US 11,271,282 B2
(45) Date of Patent: Mar. 8, 2022

(54) DISPLAY DEVICE FOR MOBILE ELECTRONIC DEVICE

(71) Applicant: SAMSUNG DISPLAY CO., LTD., Yongin-si (KR)

(72) Inventor: Nam Jin Jang, Busan (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 405 days.

(21) Appl. No.: 15/655,358

(22) Filed: Jul. 20, 2017

(65) Prior Publication Data

US 2018/0034130 A1 Feb. 1, 2018

(30) Foreign Application Priority Data

Jul. 28, 2016 (KR) .................. 10-2016-0096329

(51) Int. Cl.
H01Q 1/22 (2006.01)
H01Q 1/44 (2006.01)
G06F 1/16 (2006.01)
H01L 27/32 (2006.01)
H01Q 1/38 (2006.01)
H01Q 9/04 (2006.01)
G06F 3/041 (2006.01)

(52) U.S. Cl.
CPC ......... *H01Q 1/2266* (2013.01); *G06F 1/1652* (2013.01); *G06F 1/1698* (2013.01); *H01L 27/3225* (2013.01); *H01Q 1/2283* (2013.01); *H01Q 1/38* (2013.01); *H01Q 1/44* (2013.01); *H01Q 9/0407* (2013.01); *G06F 1/1643* (2013.01); *G06F 3/0412* (2013.01); *H01L 27/3244* (2013.01)

(58) Field of Classification Search
CPC ........... H01L 27/3225; H01L 27/3244; H01Q 1/2266; H01Q 1/2283; H01Q 1/44; H01Q 9/0407; H01Q 1/38; G06F 1/1652; G06F 1/1698; G06F 3/0412; G06F 1/1643
See application file for complete search history.

(56) References Cited

U.S. PATENT DOCUMENTS 10,474,282 B2 * 11/2019 Park .................. G06F 1/1647
2009/0051620 A1 * 2/2009 Ishibashi ............... H01Q 9/30
343/897

(Continued)

FOREIGN PATENT DOCUMENTS

EP 3098699 A1 * 11/2016 ........... H01Q 1/1271
JP 5682464 1/2015

(Continued)

*Primary Examiner* — Graham P Smith
*Assistant Examiner* — Jae K Kim
(74) *Attorney, Agent, or Firm* — F. Chau & Associates, LLC

(57) ABSTRACT

A display device includes a display panel having a display area, in which an image is displayed, and a non-display area, in which no image is displayed. A window overlaps the display panel. An antenna sheet is disposed between the display panel and the window. The antenna sheet includes a first antenna portion having a mesh shape, and a second antenna portion integrally connected to the first antenna portion and having a frame shape. The first antenna portion corresponds to the display area and the second antenna portion corresponds to the non-display area.

19 Claims, 16 Drawing Sheets

(56) References Cited

U.S. PATENT DOCUMENTS

| | | | |
|---|---|---|---|
| 2010/0021695 A1* | 1/2010 | Naoyuki | B41N 1/06 |
| | | | 428/173 |
| 2012/0287002 A1* | 11/2012 | Parsche | H01L 31/048 |
| | | | 343/702 |
| 2012/0287017 A1* | 11/2012 | Parsche | H01Q 1/243 |
| | | | 343/897 |
| 2012/0287018 A1* | 11/2012 | Parsche | H01Q 1/38 |
| | | | 343/897 |
| 2014/0106684 A1* | 4/2014 | Burns | H01Q 21/28 |
| | | | 455/78 |
| 2014/0139379 A1* | 5/2014 | Bolin | H01Q 1/243 |
| | | | 343/702 |
| 2016/0190678 A1* | 6/2016 | Hong | H01Q 1/273 |
| | | | 343/700 MS |
| 2016/0344089 A1* | 11/2016 | Baik | G04G 21/08 |
| 2016/0351634 A1* | 12/2016 | Lim | G06F 1/1698 |
| 2016/0351855 A1* | 12/2016 | Yang | H01L 51/5275 |
| 2018/0046283 A1* | 2/2018 | Yoshida | G06F 3/0446 |
| 2019/0004662 A1* | 1/2019 | Gagne-Keats | G06F 3/0416 |
| 2019/0278130 A1* | 9/2019 | Lim | G02F 1/134309 |

FOREIGN PATENT DOCUMENTS

| | | |
|---|---|---|
| KR | 20-2011-0010199 | 10/2011 |
| KR | 10-2016-0050467 | 5/2016 |

* cited by examiner

DISPLAY DEVICE FOR MOBILE ELECTRONIC DEVICE

CROSS-REFERENCE TO RELATED APPLICATIONS

This application claims priority to and the benefit of Korean Patent Application No. 10-2016-0096329 filed in the Korean Intellectual Property Office on Jul. 28, 2016, the entire contents of which are incorporated by reference herein.

TECHNICAL FIELD

The present disclosure relates to a display device, and more specifically, to a display device capable of being applied to a mobile electronic device.

DISCUSSION OF THE RELATED ART

A mobile electronic device, such as a smart phone, a smart watch, a tablet PC, and the like, uses various wireless communication technologies to send and receive data. Examples of wireless communication technologies used include a wireless local area network (w-LAN), such as Wi-Fi technology, Bluetooth, and near field communication (NFC), as well as cellular mobile communication network technologies such as GSM, CDMA, and LTE.

The mobile electronic device includes one or more antenna for facilitating the wireless communication. The antenna, as a component of the communication device, is generally mounted outside a display device and inside a case of the mobile electronic device.

As mobile electronic devices have been getting thinner and more of the area of the mobile electronic devices is taken up by the display, there is less available space in which the antenna can be installed.

SUMMARY

A display device includes a display panel having a display area, in which an image is displayed, and a non-display area, in which no image is displayed. A window overlaps the display panel. An antenna sheet is disposed between the display panel and the window. The antenna sheet includes a first antenna portion having a mesh shape, and a second antenna portion integrally connected to the first antenna portion and having a frame shape. The first antenna portion corresponds to the display area and the second antenna portion corresponds to the non-display area.

A mobile electronic device includes a display panel having a display area in which a plurality of pixels are disposed, and a peripheral region surrounding the display area. A window has a light-blocking frame and a transparent interior. The light-blocking frame substantially aligns with the peripheral region of the display panel and the transparent interior substantially aligns with the display area of the display panel. An antenna sheet is disposed between the display panel and the window. The antenna sheet includes a solid portion substantially aligning with the light-blocking frame of the window and the peripheral region of the display panel. The antenna sheet further includes a mesh portion substantially aligning with the transparent interior of the window and the display area of the display panel.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

DETAILED DESCRIPTION

Figure 1:
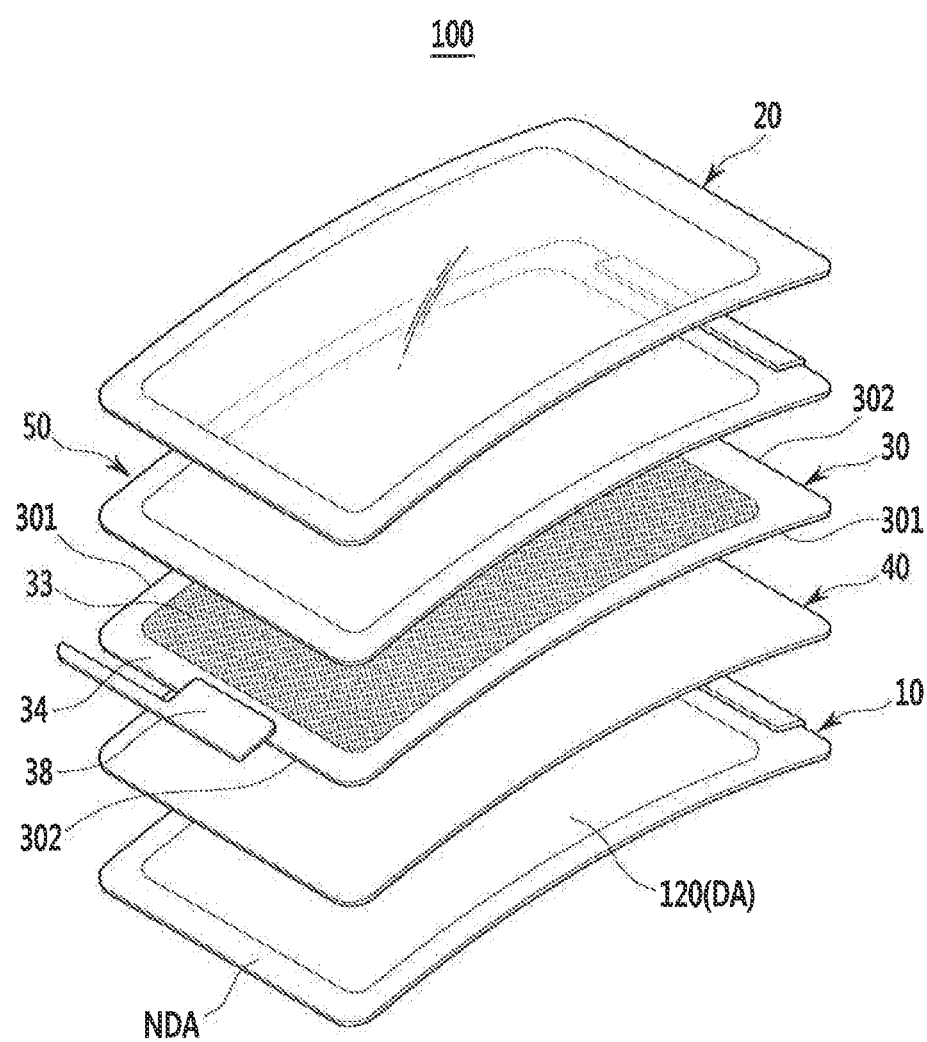
FIG. 1 is an exploded perspective view illustrating a display device according to an exemplary embodiment of the present inventive concept.

In describing exemplary embodiments of the present disclosure illustrated in the drawings, specific terminology is employed for sake of clarity. However, the present disclosure is not intended to be limited to the specific terminology so selected, and it is to be understood that each specific element includes all technical equivalents which operate in a similar manner.

It will be understood that when an element such as a layer, film, region, or substrate is referred to as being "on" another element, it can be directly on the other element or intervening elements may also be present.

Figure 2:
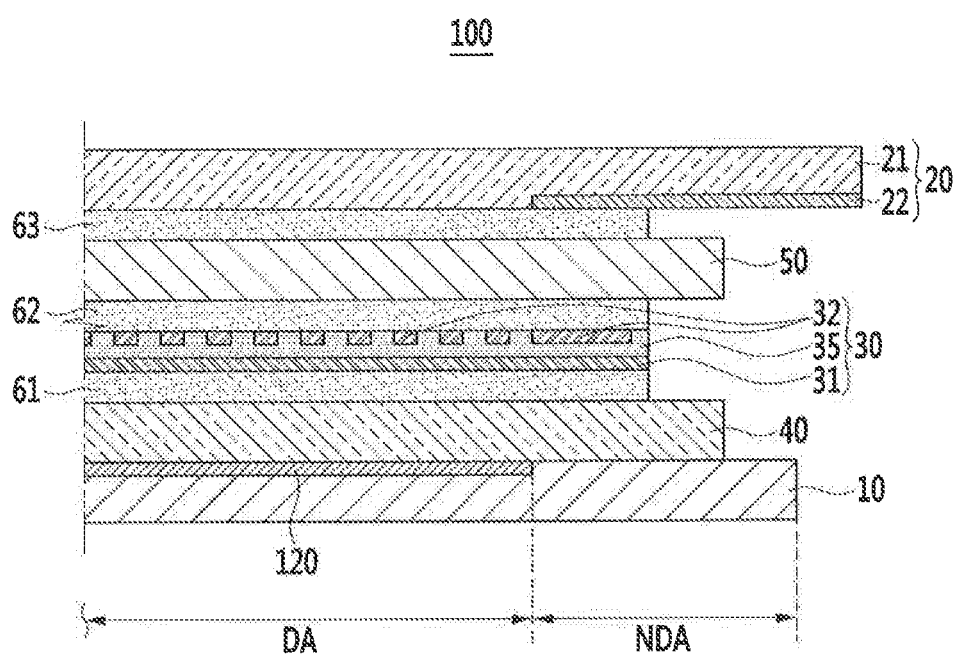
FIG. 2 is a cross-sectional view illustrating a bonding shape of a display device shown in FIG. 1.

FIG. 1 is an exploded perspective view of a display device according to an exemplary embodiment of the present inventive concept, and FIG. 2 is a cross-sectional view showing a bonding shape of a display device shown in FIG. 1.

Referring to FIG. 1 and FIG. 2, the display device 100, according to an exemplary embodiment of the present inventive concept, include a display panel 10, a window 20 overlapping the display panel 10, and an antenna sheet 30 disposed between the display panel 10 and the window 20.

A polarization film 40 may be disposed between the display panel 10 and the antenna sheet 30, and a touch panel 50 may be disposed between the antenna sheet 30 and the window 20. A cover panel may be disposed at the back of the display panel 10. The display panel 10 may an organic light emitting panel, a liquid crystal panel, or an electrophoretic display panel, however, the display panel may alternatively be of a different type than those listed.

The display panel 10 includes a display area DA for displaying an image and a non-display area NDA enclosing the display area DA. When the display area DA is quadrangular, the non-display area NDA may have a quadrangular frame shape, and when the display area DA is circular, the non-display area NDA may have a circular ring shape.

The display panel 10 may be a flexible display panel including a flexible substrate. FIG. 1 shows a flexible display panel 10 bent along one direction as an example. In the case of FIG. 1, the window 20, the touch panel 50, the antenna sheet 30, and the polarization film 40 are also bent with the same curvature as the flexible display panel 10.

Figure 3:
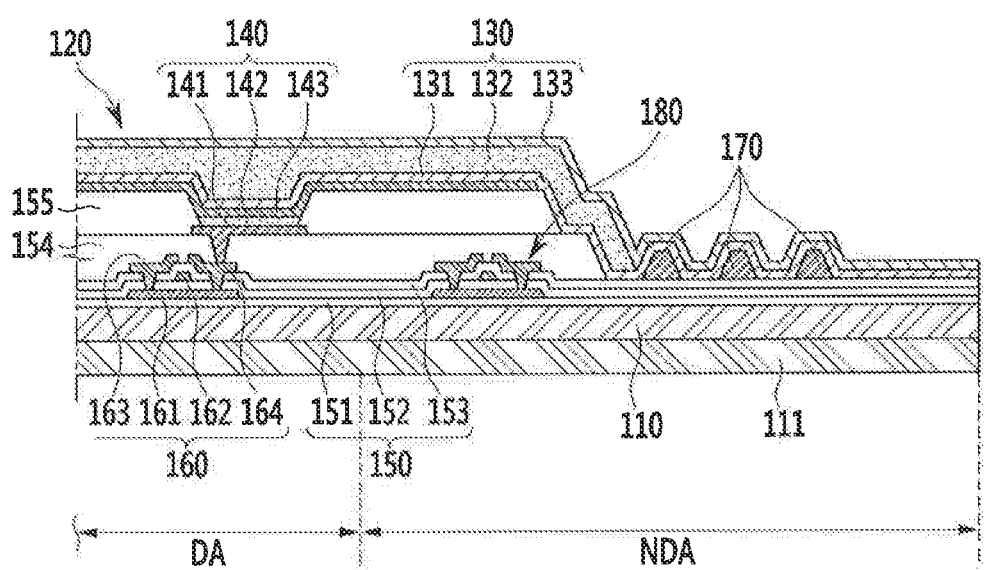
FIG. 3 is an enlarged cross-sectional view illustrating an organic light emitting panel of a display panel of a display device shown in FIG. 1, according to an exemplary embodiment of the present inventive concept.

FIG. 3 is an enlarged cross-sectional view of an exemplary organic light emitting panel of a display panel of a display device shown in FIG. 1. A structure of the display panel that is described below is an exemplary embodiment of the present inventive concept, and the display panel is not limited to the below-described structure.

Referring to FIG. 3, the organic light emitting panel includes a substrate 110, and a display unit 120 and a thin film encapsulation 130 formed on the substrate 110.

The substrate 110 may be a flexible substrate such as a plastic film. The flexible substrate 110 may be a multi-layered structure in which two polyimide films are deposited via a silicon nitride layer or a silicon oxide layer interposed therebetween. A lower protection film 111 may be disposed under the flexible substrate 110, and an upper protection film may be disposed on the thin film encapsulation 130.

The display unit 120 includes a plurality of pixels and is disposed within the display area DA of the substrate 110. The display unit 120 may include an organic light emitting element 140, an insulating layer 150, and a thin film transistor 160 connected to the organic light emitting element 140. The display unit 120 may further include a scan wire, a data wire, a capacitor, and other thin film transistors.

The thin film transistor 160 includes a semiconductor layer 161, a gate electrode 162, a source electrode 163, and a drain electrode 164. The semiconductor layer 161 includes a channel region, which is not doped with an impurity, and a source region and a drain region, which are disposed at opposite sides of the channel region and are doped with an impurity. The gate insulating layer 162 is formed on the semiconductor layer 161. The source electrode 163 and the drain electrode 164 are disposed on the gate electrode 162 and are respectively connected to the source region and the drain region of the semiconductor layer 161 through contact holes.

The insulating layer 150 includes a first sub-insulating layer 151, a second sub-insulating layer 152, and a third sub-insulating layer 153. The first sub-insulating layer 151 is disposed between the substrate 110 and the semiconductor layer 161, flattens/planarizes the surface of the substrate 110, and prevents moisture from permeating from the substrate 110 toward the semiconductor layer 161. The second sub-insulating layer 152 covers the semiconductor layer 161 and prevents a short circuit between the semiconductor layer 161 and the gate electrode 162. The third sub-insulating layer 153 covers the gate electrode 162 and prevents a short circuit between the gate electrode 162 and the source electrode 163 and prevents a short circuit between the gate electrode 162 and the drain electrode 164.

The organic light emitting element 140 includes a first electrode 141 connected to the drain electrode 164 of the thin film transistor 160, an organic emission layer 142 disposed on the first electrode 141, and a second electrode 143 disposed on the organic emission layer 142. One of the first electrode 141 and the second electrode 143 is an anode as a hole injection electrode, and the other is a cathode as an electron injection electrode. The first electrode 141 is disposed one by one for each pixel, and the second electrode 143 is disposed throughout the entire display area DA.

Light emitted from the organic emission layer 142 may be transmitted through the first electrode 141 and the substrate 110, or may be transmitted through the second electrode 143 and the thin film encapsulation 130. In the former, the substrate 110 is disposed closer to the window 20 than is the thin film encapsulation 130 (referring to FIG. 1), while in the latter, the thin film encapsulation 130 is disposed closer to the window 20 than is the substrate 110 (referring to FIG. 1). In FIG. 3, element number 154 indicates a planarization layer covering the source electrode 163 and the drain electrode 164, and element number 155 indicates a pixel definition layer defining a formation region of the organic emission layer 142.

The thin film encapsulation 130 covers the display unit 120 to isolate the display unit 120 from external air. The thin film encapsulation 130 may include multiple layers of an inorganic layer and an organic layer. In this case, the thin film encapsulation 130 includes a first inorganic layer 131 disposed on the second electrode 143, an organic layer 132 disposed on the first inorganic layer 131, and a second inorganic layer 133 disposed on the organic layer 132. Other organic layers and other inorganic layers may be further disposed on the second inorganic layer 133.

The insulating layer 150 may be entirely disposed on the display area DA and the non-display area NDA. A plurality of blocking layers 170 may be disposed on the insulating layer 150 in the non-display area NDA. The plurality of blocking layers 170 are disposed with a predetermined distance therebetween along a surface direction (a horizontal direction based on FIG. 3) of the substrate 110.

The first inorganic layer 131 and the second inorganic layer 133 may be disposed throughout the entire non-display area NDA while covering the plurality of blocking layers 170, and the edge of the organic layer 132 may be disposed to be closer to the display area DA than the plurality of blocking layers 170. The plurality of blocking layers 170 prevents the organic layer 132 from overflowing when forming the thin film encapsulation 130.

At least one circuit element 180 may be disposed between the display unit 120 and the blocking layer 170. The circuit element 180 performs transmission or conversion of an electric signal to drive the organic light emitting element 140.

Again, referring to FIG. 1 and FIG. 2, the polarization film 40 is disposed on the display panel 10. The polarization film 40 may include multiple layers of a linear polarization layer and a ¼ wavelength layer (quarter-wave plate). The polarization film 40 may suppress external light reflection.

For example, incident external light is linearly-polarized by the linear polarization layer and is circularly-polarized, in one direction, while passing through the ¼ wavelength layer (quarter-wave plate). The rotation direction is reversed while the circular polarized light is reflected by the metal layers of the display unit 120, and the circular polarized light is converted to linearly polarized light while passing through the ¼ wavelength layer (quarter-wave plate). A vibration direction of the linearly polarized light is perpendicular to a transmissive axis of the linear polarization layer such that the linearly polarized light does not pass through the linear polarization layer.

The antenna sheet 30 to receive and transmit a wireless signal is disposed on the polarization film 40. A size of the antenna sheet 30 may be larger than the size of the display area DA, and may be equal to or smaller than the size of the display panel 10. A first adhesive layer 61 may be disposed between the antenna sheet 30 and the polarization film 40.

Figure 4:
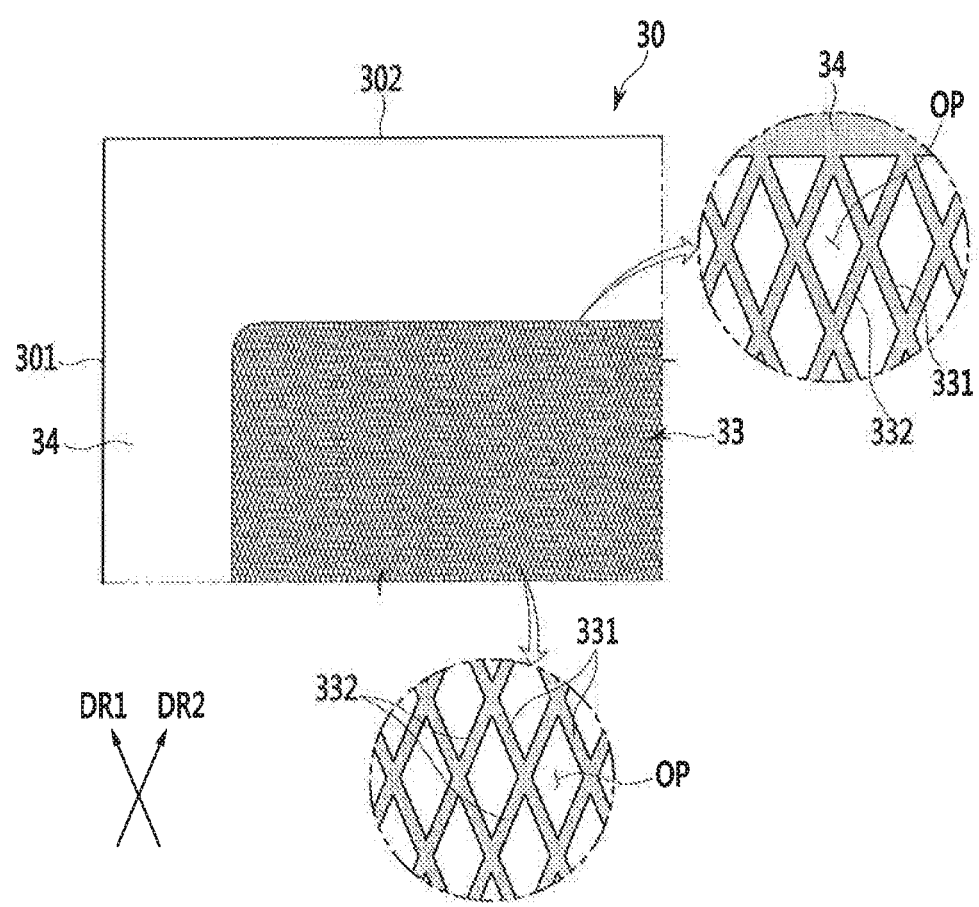
FIG. 4 is a partially enlarged view illustrating an antenna sheet in a display device shown in FIG. 1.

FIG. 4 is a partially enlarged view of an antenna sheet in a display device shown in FIG. 1.

Referring to FIG. 2 and FIG. 4, the antenna sheet 30 includes a base material film 31 and a metal layer 32 disposed on the base material film 31. The metal layer 32 includes a first antenna portion 33 of a mesh shape corresponding to the display area DA of the display panel 10, and a second antenna portion 34 enclosing the first antenna portion 33 and corresponding to the non-display area NDA of the display panel 10.

The first antenna portion 33 includes a plurality of first metal lines 331 extending along a first direction DR1, and a plurality of second metal lines 332 extending along a second direction DR2 crossing the first direction DR1. The plurality of first metal lines 331 and the plurality of second metal lines 332 are integrally connected to each other at side surfaces thereof. The antenna sheet 30 may have a pair of long sides 301 and a pair of short sides 302, and the first direction DR1 and the second direction DR2 may be diagonal directions of the antenna sheet 30 crossing both of the long side 301 and the short side 302.

The first antenna portion 33 includes a plurality of openings OP. The plurality of openings OP are respectively disposed between two adjacent first metal lines 331 and between two adjacent second metal lines 332. In the entire first antenna portion 33, the plurality of opening OP may have the same size and may be uniformly disposed.

For example, the plurality of first metal lines 331 and the plurality of second metal lines 332 may have the same width. Also, the plurality of first metal lines 331 may be aligned with a predetermined distance between each other, and the plurality of second metal lines 332 may be aligned with a predetermined distance between each other. Further, a distance between two adjacent first metal lines 331 may be the same as a distance between two adjacent second metal lines 332.

The plurality of first metal lines 331 and the plurality of second metal lines 332 may have a width of about 2 μm to 3 μm, respectively. The size of the plurality of openings OP is larger than the size of one of pixels provided in the display unit 120, and a plurality of pixels are disposed to correspond to one opening OP.

The first antenna portion 33 transmits light emitted in the display area DA of the display panel 10 through the plurality of openings OP toward the window 20. The first antenna portion. 33 is not observed by the naked eye such that the first antenna unit 33 may be substantially transparent and may have a light transmittance of about 80% to 90%.

The second antenna portion 34 is integrally connected with the first antenna portion 33. For example, an end part of the plurality of first metal lines 331 and an end part of the plurality of second metal lines 332 are integrally connected with an inner side surface of the second antenna portion 34. The second antenna portion 34 has the frame shape corresponding to the non-display area NDA of the display panel 10 and does not have openings thereby having a higher density than the first antenna portion 33. The second antenna portion 34 reinforces the performance of the first antenna portion 33, thereby increasing the performance of the antenna sheet 30.

The antenna sheet 30 may include a resin layer 35 disposed between the base material film 31 and the metal layer 32. The resin layer 35 may include a recess portion with the same shape as the metal layer 32, and the metal layer 32 may be disposed at the recess portion. The antenna sheet 30 may be manufactured by a process that is described in detail below.

FIG. 5A to FIG. 5D are cross-sectional views showing a manufacturing process of an antenna sheet in a display device shown in FIG. 1. The manufacturing process shown in FIG. 5A to FIG. 5D represents an exemplary embodiment of the present inventive concept, and the antenna sheet may be manufactured in other ways.

Figure 5A:
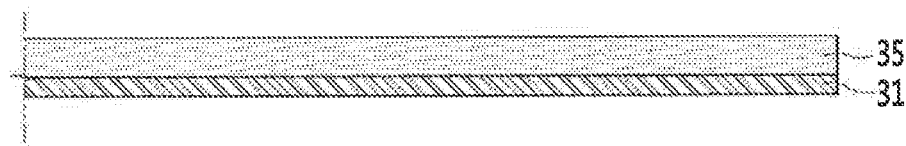
FIG. 5A to FIG. 5D are cross-sectional views illustrating a manufacturing process of an antenna sheet in a display device shown in FIG. 1.
Figure 5B:
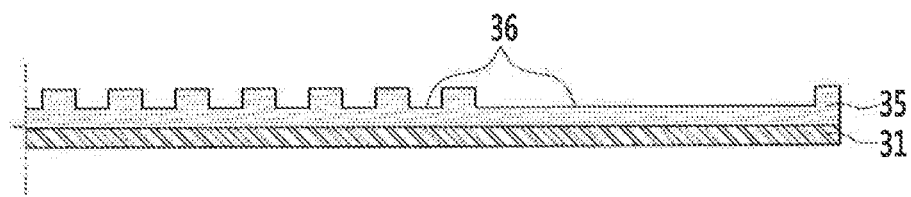

Referring to FIG. 5A, a resin layer 35 is formed on a base material film 31. The resin layer 35 may include an ultraviolet ray curing resin and may be formed by a general coating method. Referring to FIG. 5B, an imprint mold presses the resin layer 35 to form a recess portion 36 at an upper surface of the resin layer 35. The recess portion 36 has the same shape as a metal layer that is previously designed.

Figure 5C:
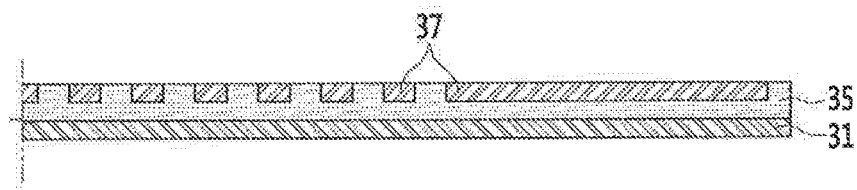
Figure 5D:
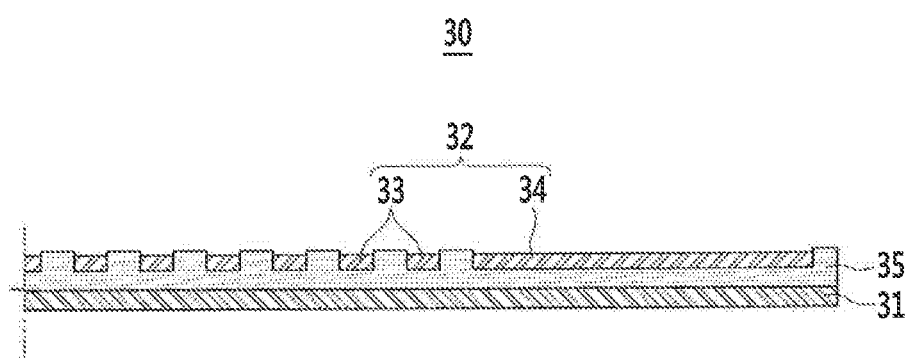

Referring to FIG. 5C, a metal paste 37 is printed on the recess portion 36 of the resin layer 35. The metal paste 37 includes metal particles of silver, copper, and/or aluminum, and organic materials. Referring to FIG. 5D, the resin layer 35 and the metal paste 37 are exposed ultraviolet rays during a thermal treatment. The resin layer 35 is cured hard by the ultraviolet rays and the organic materials included in the metal paste are removed by the thermal treatment, thereby completing a metal layer 32. A thickness of the metal layer 32 may be smaller than a depth of the recess portion 36.

When the resin layer 35 includes the recess portion 36 and the metal layer 32 is disposed at the recess portion 36, spreading of the metal paste 37 may be prevented in the manufacturing process of the antenna sheet 30. Accordingly, in the first antenna portion 33, a plurality of first metal lines 331 and a plurality of second metal lines 332 may maintain an intended minute line width. When the antenna sheet 30 includes the resin layer 35, the opening OP of the first antenna portion 33 is filled with the resin layer 35.

Again, referring to FIG. 1 and FIG. 2, the antenna sheet 30 may further include an access member 38 fixed to the second antenna portion 34. The access member 38 is electrically connected to a controller. A touch panel 50 is disposed on the antenna sheet 30. A second adhesive layer 62 may be disposed between the antenna sheet 30 and the touch panel 50.

The touch panel 50, as an input device of the display device 100, includes a touch sensor capable of sensing touch input inputting information generated by contacting a screen by a finger or a pen of a user. The touch sensor may be operated by various methods, for example, the touch sensor may be of a capacitive type for sensing a position where a capacitance change is generated depending on the point of contact. The touch panel 50 may have various structures.

The window 20 is disposed on the touch panel 50. The window 20 is disposed at a highest part of the display device 100 to protect the touch panel 50 and the display panel 1 from an impact or external interference. A third adhesive layer 63 may be disposed between the touch panel 50 and the window 20.

The window 20 may include a transparent substrate 21 and a light blocking film 22 disposed directly under the transparent substrate 21 and corresponding to the non-display area NDA of the display panel 10. Among the transparent substrate 21, a part that does not overlap the light blocking film 22 is a light transmission region, and a part overlapping the light blocking film 22 is a light blocking region. The light blocking film 22 prevents the non-display area NDA of the display panel 10 from being seen by the user.

The display device 100 of the above-described approach includes the antenna sheet 30 overlapping the display panel 10. Accordingly, the electronic device including the display device 100, for example, the mobile electronic device, may do without a separate antenna that is disposed outside the display device 100 such that the entire structure may be simplified and the entire thickness may be minimized.

Figure 6:
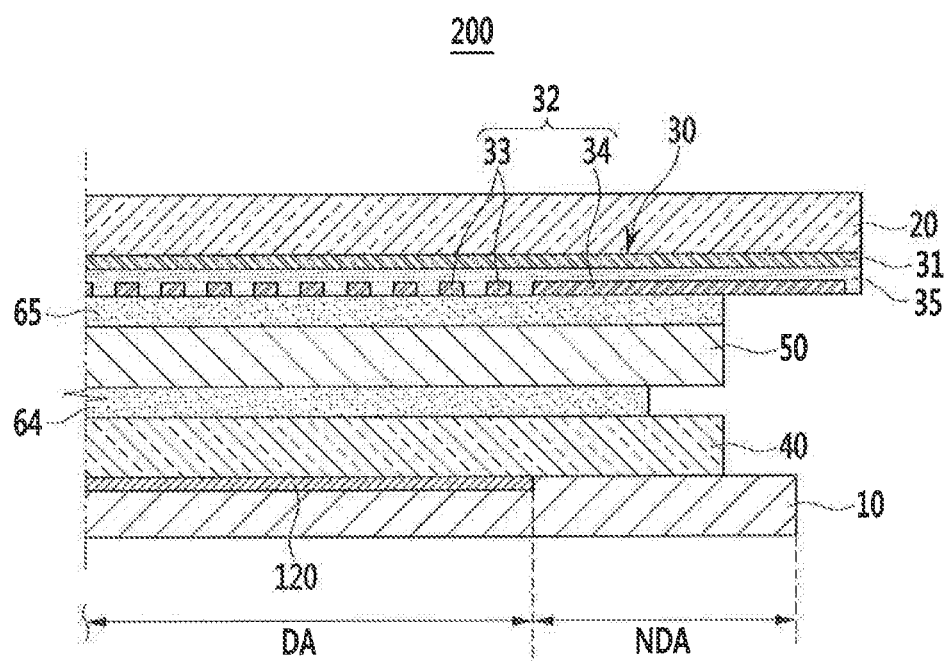
FIG. 6 is a partial cross-sectional view illustrating a display device according to an exemplary embodiment of the present inventive concept.

FIG. 6 is a partial cross-sectional view of a display device according to an exemplary embodiment of the present inventive concept.

Referring to FIG. 6, in the display device 200, according to an exemplary embodiment of the present inventive concept, the antenna sheet 30 is disposed directly under the window 20, and the second antenna portion 34 of the antenna sheet 30 functions as the light blocking film. The size of the antenna sheet 30 may be the same as the size of the window 20.

For example, the window 20 is made of the transparent substrate, and the antenna sheet 30 is in contact with a lower surface of the transparent substrate. Among the window 20, the part overlapping the first antenna portion 33 becomes the light transmission region, and the part overlapping the second antenna portion 34 becomes the light blocking region. The second antenna portion 34 does not transmit the light, thereby preventing the non-display area NDA of the display panel 10 from being recognized at the side of the user.

The touch panel 50 may be disposed on the polarization film 40, and a fourth adhesive layer 64 may be disposed between the polarization film 40 and the touch panel 50. The antenna sheet 30 and the window 20 may be disposed on the touch panel 50, and a fifth adhesive layer 65 may be disposed between the touch panel 50 and the antenna sheet 30. A base material film 31 of the antenna sheet 30 may be in contact with the lower surface of the window 20, and the metal layer 32 may be in contact with the fifth adhesive layer 65.

The display device 200 may omit the light blocking film described above because of the integral structure of the window 20 and the antenna sheet 30, and one of the adhesive layers may be omitted, as compared with the approach described above. The display device 200 here may be made with a configuration that is the same as or similar to that of one of the display device of the above-described exemplary embodiment, except for the omission of the light blocking film and the position of the antenna sheet 30.

Figure 7:
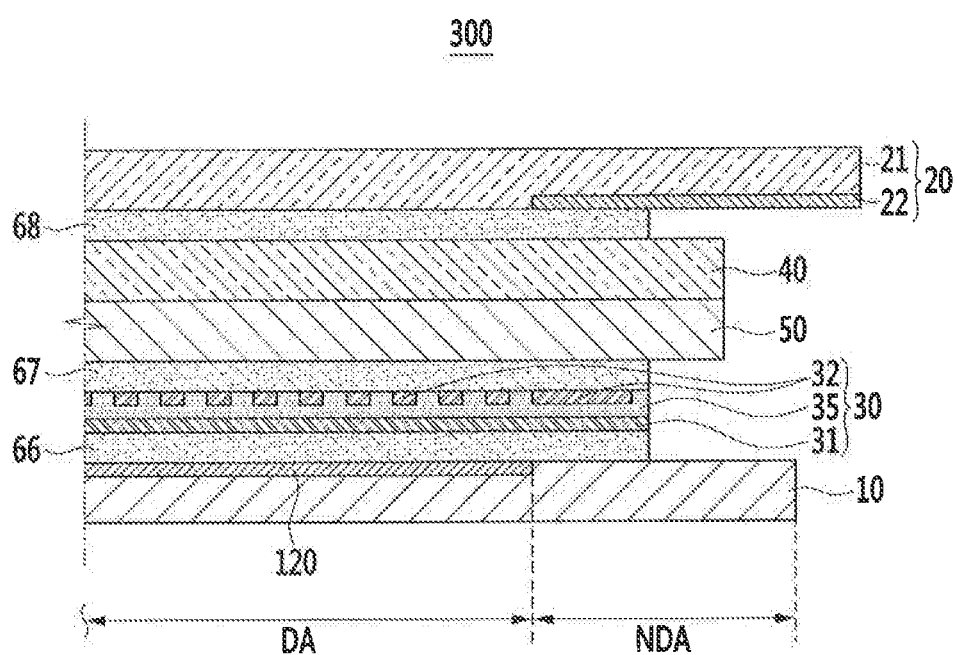
FIG. 7 is a partial cross-sectional view illustrating a display device according to an exemplary embodiment of the present inventive concept.

FIG. 7 is a partial cross-sectional view of a display device according to an exemplary embodiment of the present inventive concept.

Referring to FIG. 7, in the display device 300 of the third exemplary embodiment, the antenna sheet 30 is disposed between the display panel 10 and the touch panel 50, and the polarization film 40 is disposed on the touch panel 50.

In detail, the antenna sheet 30 may be disposed on the display panel 10, and a sixth adhesive layer 66 may be disposed between the display panel 10 and the antenna sheet 30. The touch panel 50 may be disposed on the antenna sheet 30, and a seventh adhesive layer 67 may be disposed between the antenna sheet 30 and the touch panel 50. The polarization film 40 may be disposed on the touch panel 50, and the window 20 may be disposed on the polarization film 40. An eighth adhesive layer 68 may be disposed between the polarization film 40 and the window 20.

The window 20 may include the transparent substrate 21 as well as the light blocking film 22 corresponding to the non-display area NDA of the display panel 10. The light blocking film 22 prevents the non-display area NDA of the display panel 10 from being seen by the user.

The display device 300 may be made with a configuration that is the same as or similar to that of one of the above-described approach except for the polarization film 40 being disposed on the touch panel 50.

Figure 8:
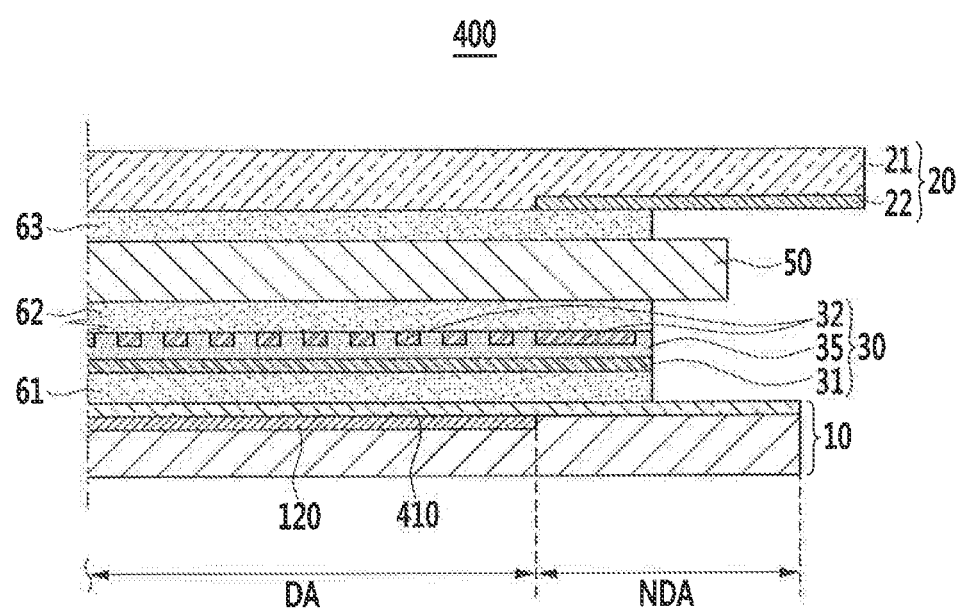
FIG. 8 is a partial cross-sectional view illustrating a display device according to an exemplary embodiment of the present inventive concept.

FIG. 8 is a partial cross-sectional view of a display device according to an exemplary embodiment of the present inventive concept.

Referring to FIG. 8, in the display device 400, the display panel 10 includes a color filter layer 410, and the touch panel 50 is disposed between the antenna sheet 30 and the window 20.

The color filter layer 410 includes a red filter, a blue filter, and a green filter arranged in parallel with a predetermined distance therebetween. Each of the red filter, the blue filter, and the green filter may correspond to one organic light emitting element 140 (referring to FIG. 3) disposed at the display unit 120. The color filter layer 410 may include a black color layer disposed between the red filter, the blue filter, and the green filter.

Each of the red filter, the blue filter, and the green filter absorbs visible light that is of a color other than its own specific color, thereby reducing external reflection. Also, the black color layer absorbs all visible light components of the external light incident to the display device. Accordingly, the color filter layer may replace the polarization film described above.

The display device 400 may be made with a configuration that is the same as or similar to that of one of the above-described approach except for the polarization film that is replaced by the color filter layer 410 of the display panel 10.

Figure 9:
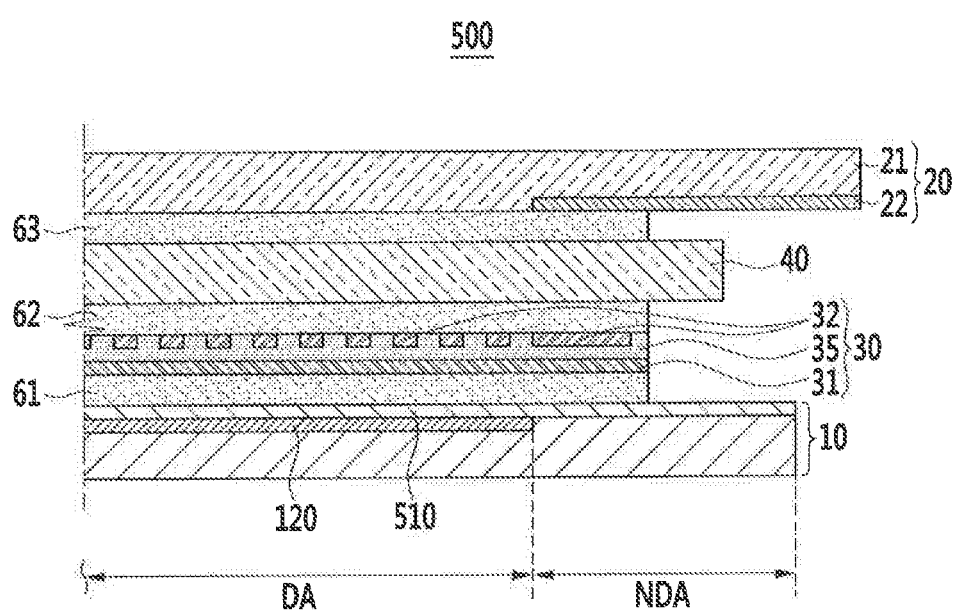
FIG. 9 is a partial cross-sectional view illustrating a display device according to an exemplary embodiment of the present inventive concept.

FIG. 9 is a partial cross-sectional view of a display device according to an exemplary embodiment of the present inventive concept.

Referring to FIG. 9, in the display device 500, the display panel 10 includes a touch sensing unit 510, and the polarization film 40 is disposed between the antenna sheet 30 and the window 20.

The touch sensing unit 510 uses a film that may allow for the omission of the substrate. For example, the touch sensing unit 510 may include a plurality of touch sensing electrodes disposed on an upper protection film covering the thin film encapsulation 130 (referring to FIG. 3).

The display device 500 may be made with a configuration that is the same as or similar to that of one of the above-described embodiment except for the touch panel that is replaced with the touch sensing unit 510 of the display panel 10.

Figure 10:
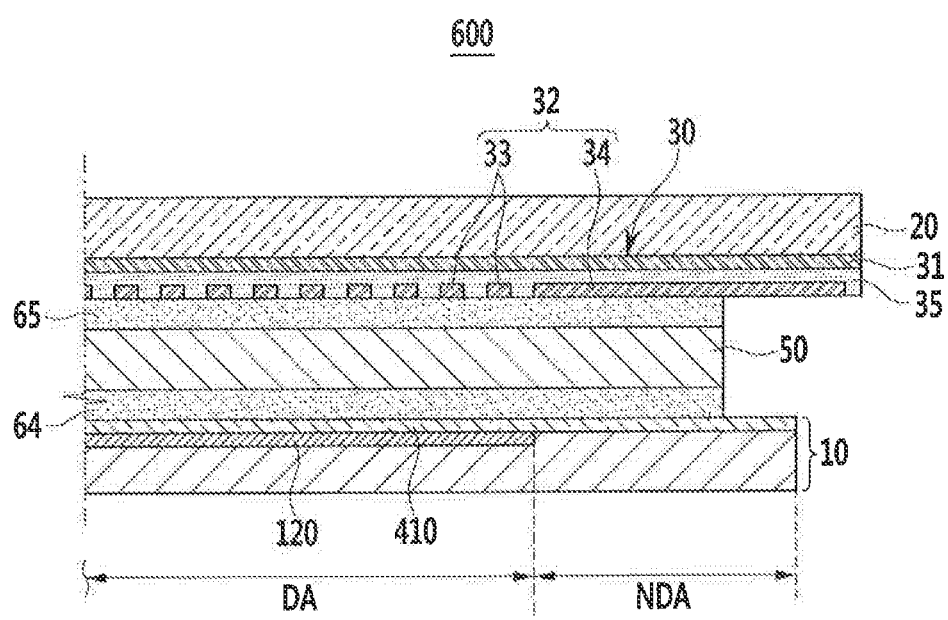
FIG. 10 is a partial cross-sectional view illustrating a display device according to an exemplary embodiment of the present inventive concept.

FIG. 10 is a partial cross-sectional view of a display device according to an exemplary embodiment of the present inventive concept.

Referring to FIG. 10, in the display device 600, the display panel 10 includes the color filter layer 410, and the touch panel 50 is disposed between the display panel 10 and the antenna sheet 30.

The structure of the color filter layer 410 may be the same as an approach described above and any details omitted may be understood to be similar to or the same as corresponding details that have already been described. The display device 600 may be made with a configuration that is the same as or similar to that of one of the above-described configurations except for the polarization film that is replaced with the color filter layer 410 of the display panel 10.

Figure 11:
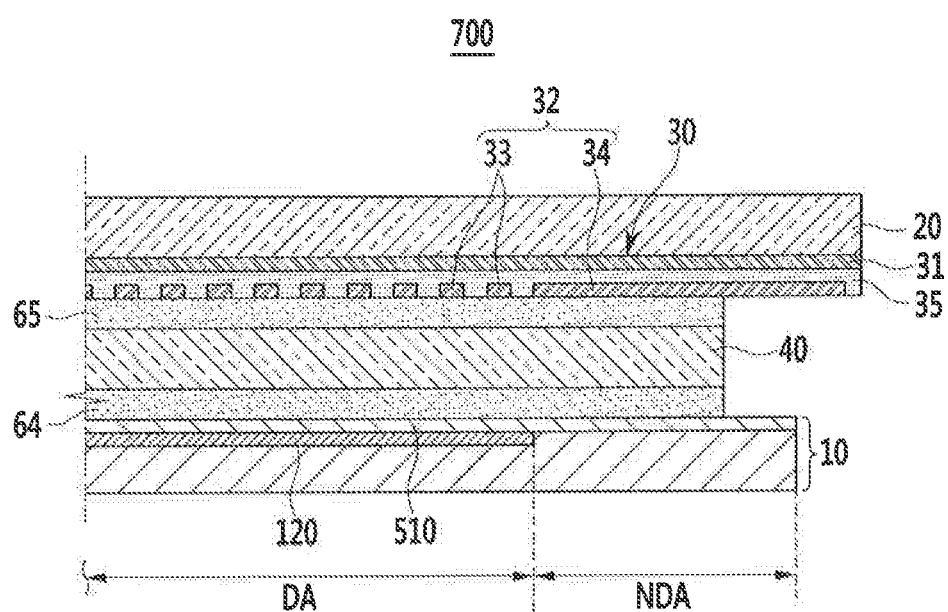
FIG. 11 is a partial cross-sectional view illustrating a display device according to an exemplary embodiment of the present inventive concept.

FIG. 11 is a partial cross-sectional view of a display device according to an exemplary embodiment of the present inventive concept.

Referring to FIG. 11, in the display device 700, the display panel 10 includes the touch sensing unit 510, and the polarization film 40 is disposed between the touch sensing unit 510 and the antenna sheet 30.

The structure of the touch sensing unit 510 may be the same as that of one of the approaches described above and any details omitted may be understood to be similar to or the same as corresponding details that have already been described. The display device 700 may be made with a configuration that is the same as or similar to that of one of the above-described approaches except for the touch panel that is replaced with the touch sensing unit 510.

Figure 12A:
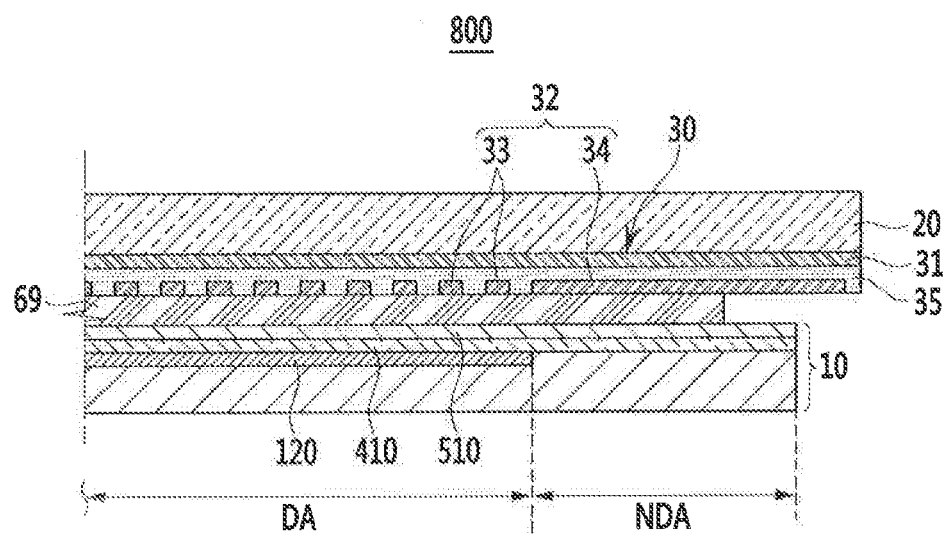
FIG. 12A and FIG. 12B are partial cross-sectional views illustrating a display device according to an exemplary embodiment of the present inventive concept.
Figure 12B:
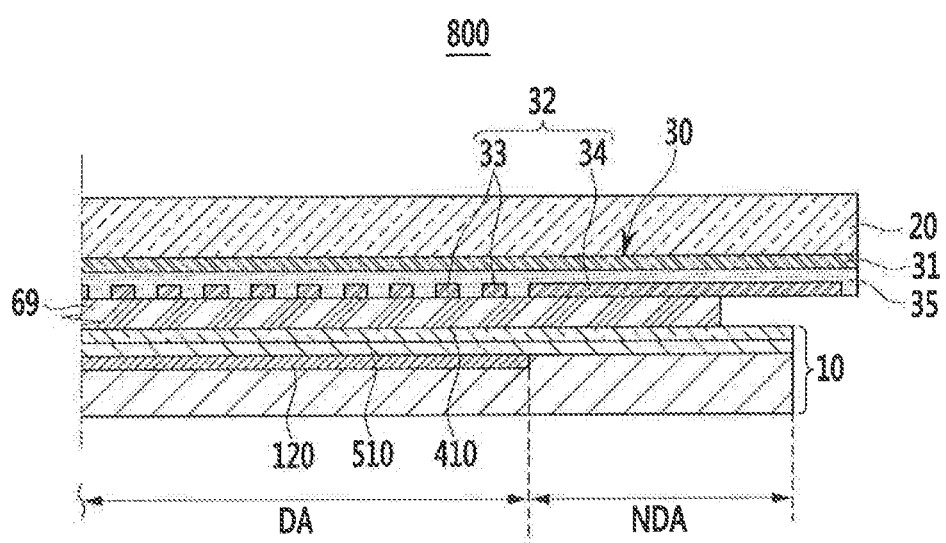

FIG. 12A and FIG. 12B are partial cross-sectional views of a display device according to an exemplary embodiment of the present inventive concept.

Referring to FIG. 12A and FIG. 12B, in the display device 800, the display panel 10 includes the color filter layer 410 and the touch sensing unit 510. The structure of the color filter layer 410 may be the same as that of the one of the approaches described above and the structure of the touch sensing unit 510 is the same as one of the approaches described above and any details omitted may be understood to be similar to or the same as corresponding details that have already been described.

In a case of FIG. 12A, the color filter layer 410 is disposed between the display unit 120 and the touch sensing unit 510. In this case, the color filter layer 410 and the touch sensing unit 510 may share the substrate. For example, the plurality of color filters and the black color layer may be disposed at one surface of the substrate, and the plurality of touch sensing electrodes may be disposed at the other surface of the substrate. In a case of FIG. 12B, the touch sensing unit 510 is disposed between the display unit 120 and the color filter layer 410. In this case, the touch sensing unit 510 may use the upper protection film covering the thin film encapsulation 130 (referring to FIG. 3) as the substrate.

In the above-described display devices 100, 200, and 300, the antenna sheet 30 is disposed between the display panel 10 and the window 20. Also, the polarization film 40 and the touch panel 50 are disposed between the display panel 10 and the antenna sheet 30, however they may alternatively be disposed between the antenna sheet 30 and the window 20.

In the above-described display devices 400, 500, 600, 700, and 800, the display panel 10 includes either the color filter layer 410 or the touch sensing unit 510. The color filter layer 410 replaces the polarization film, and the touch sensing unit 510 replaces the touch panel. The display devices 400, 500, 600, 700, and 800 may reduce the total thickness.

While exemplary embodiments of the present inventive concept have been described in connection with the figures, it is to be understood that the invention is not limited to the disclosed embodiments, but, on the contrary, is intended to cover various modifications and equivalent arrangements.

What is claimed is:

1. A display device comprising:
   a display panel including a display area, in which an image is displayed, and a non-display area, in which no image is displayed;
   a window overlapping the display panel; and
   an antenna sheet disposed between the display panel and the window,
   wherein the antenna sheet includes a first antenna portion having a mesh shape, and a second antenna portion integrally connected to the first antenna portion and having a solid-frame, non-mesh shape,
   wherein the first antenna portion overlaps the display area,
   wherein the second antenna portion overlaps the non-display area, and
   wherein the antenna sheet includes a base material film and a metal layer that is disposed on the base material film, and the metal layer includes the first antenna portion and the second antenna portion.

2. The display device of claim 1, wherein: the antenna sheet includes a resin layer disposed between the base material film and the metal layer, the resin layer includes a recess portion of a same planar shape as the metal layer, and the metal layer is disposed at the recess portion.

3. The display device of claim 1, wherein the first antenna portion includes a plurality of first metal lines extending along a first direction and a plurality of second metal lines extending along a second direction crossing the first direction.

4. The display device of claim 3, wherein: the antenna sheet includes a pair of long sides extended in a third direction and a pair of short sides extended in a fourth direction, and the first direction and the second direction each cross the third direction and the fourth direction.

5. The display device of claim 3, wherein: the plurality of first metal lines and the plurality of second metal lines are integrally connected at side surfaces to each other, and end parts the plurality of first metal lines and end parts of the plurality of second metal lines are integrally connected to an inner side surface of the second antenna portion.

6. The display device of claim 3, wherein: the first antenna portion includes a plurality of openings formed by the plurality of first metal lines and the plurality of second metal lines, and the plurality of openings have the same size and are uniformly disposed in the entire first antenna portion.

7. The display device of claim 1, further comprising:
   a polarization film disposed between the display panel and the antenna sheet; and
   a first adhesive layer disposed between the antenna sheet and the polarization film.

8. The display device of claim 7, further comprising:
   a touch panel disposed between the antenna sheet and the window; and
   a second adhesive layer disposed between the antenna sheet and the touch panel.

9. The display device of claim 7, wherein: the window includes a transparent substrate and a light blocking film in contact with one surface of the transparent substrate, and the light blocking film corresponding to the non-display area, and the display device further includes a third adhesive layer disposed between the touch panel and the window.

10. The display device of claim 1, wherein: the window includes a transparent substrate, the antenna sheet is in contact with one surface of the window, and the window includes a light blocking region corresponding to the second antenna portion of the antenna sheet.

11. The display device of claim 10, further comprising: a polarization film and a touch panel disposed between the display panel and the antenna sheet, and the touch panel is disposed to be closer to the window than the polarization film.

12. The display device of claim 11, further comprising: a fourth adhesive layer disposed between the polarization film and the touch panel; and a fifth adhesive layer disposed between the touch panel and the antenna sheet.

13. The display device of claim 12, wherein the antenna sheet is disposed such that the base material film is in contact with one surface of the window and the metal layer is in contact with the fifth adhesive layer.

14. The display device of claim 1, further comprising: a touch panel and a polarization film disposed between the antenna sheet and the window, and the polarization film is closer to the window than the polarization film is to the touch panel.

15. The display device of claim 14, further comprising:
  a sixth adhesive layer disposed between the display panel and the antenna sheet; and
  a seventh adhesive layer disposed between the antenna sheet and the touch panel.

16. The display device of claim 14, wherein: the window includes a transparent substrate and a light blocking film in contact with one surface of the transparent substrate, the light blocking film corresponding to the non-display area, and the display device further includes an eighth adhesive layer disposed between the polarization film and the window.

17. The display device of claim 1, wherein the display panel includes the color filter layer or the touch sensing unit.

18. The display device of claim 1, wherein: the display panel is a flexible display panel that is at least partially bent, and the antenna sheet and the window are bent corresponding to a curvature of the flexible display panel.

19. A mobile electronic device, comprising:
  a display panel having a display area in which a plurality of pixels are disposed, and a peripheral region surrounding the display area;
  a window having a light-blocking frame and a transparent interior, the light-blocking frame substantially aligning with the peripheral region of the display panel and the transparent interior substantially aligning with the display area of the display panel; and
  an antenna sheet disposed between the display panel and the window,
  wherein the antenna sheet includes a solid portion substantially aligning with the light-blocking frame of the window and the peripheral region of the display panel,
  wherein the antenna sheet further includes a mesh portion substantially aligning with the transparent interior of the window and the display area of the display panel, the solid portion and the mesh portion of the antenna sheet being disposed within a single layer, and
  wherein the antenna sheet further includes a base material film and a metal layer that is disposed on the base material film, and the metal layer includes the solid portion and the mesh portion.

* * * * *